(12) United States Patent
Tran

(10) Patent No.: US 6,639,859 B2
(45) Date of Patent: Oct. 28, 2003

(54) TEST ARRAY AND METHOD FOR TESTING MEMORY ARRAYS

(75) Inventor: Lung T. Tran, Saratoga, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 216 days.

(21) Appl. No.: 09/983,697

(22) Filed: Oct. 25, 2001

(65) Prior Publication Data

US 2003/0081477 A1 May 1, 2003

(51) Int. Cl.[7] .................................................. G11C 7/00
(52) U.S. Cl. ..................... 365/201; 365/214; 365/230.03
(58) Field of Search ............................ 365/201, 63, 60, 365/69, 214, 230.03

(56) References Cited

U.S. PATENT DOCUMENTS 5,107,459 A * 4/1992 Chu et al. ..................... 365/63
5,794,175 A * 8/1998 Conner .......................... 702/119
6,456,525 B1 * 9/2002 Perner et al. ................ 365/171
6,552,409 B2 * 4/2003 Taussig et al. ............... 257/529

\* cited by examiner

Primary Examiner—Vu A. Le

(57) ABSTRACT

A test array includes row conductors, column conductors, and memory cells located at crossing points of the row and column conductors. The test array can have groups of the row conductors or the column conductors electrically coupled, or ganged together, so that they share common terminals. Other selected row and column conductors can have individual terminals. In this configuration, memory cells located at the intersection of row and column conductors that have individual terminals can have their characteristics measured using a test apparatus. Ganging together groups of row or column conductors means that the test array has fewer terminals for connection to the test apparatus. Therefore, a test apparatus having a limited number of probes for connection to test array terminals can be used to test arrays of various sizes.

15 Claims, 2 Drawing Sheets

TEST ARRAY AND METHOD FOR TESTING MEMORY ARRAYS

TECHNICAL FIELD

The technical field is test arrays and methods for testing memory arrays. More specifically, the technical field is test methods and arrays that allow for accurate testing of arrays without undue time or expense.

BACKGROUND

Cross point memory arrays include memory cells located at cross points of horizontal row conductors and vertical column conductors. The memory cells function as the storage elements in cross point memory arrays, and can typically store binary states of either "1" or "0." The memory cells, the row and column conductors, and other circuitry may be disposed on a substrate. Examples of known cross point memory arrays include non-volatile memories such as one time programmable (OTP) memories, and re-programmable memories. Memory arrays require testing in many circumstances, such as before production on a large scale, and during the development phase of new memory arrays. Testing can involve measuring characteristics of a memory array such as the resistance of memory cells, uniformity of memory cells properties, RH response, resistance-voltage characteristics, and other characteristics.

One approach to testing is to construct a full scale memory array tester including a full integration of driver circuitry, switching circuitry, and other peripheral circuitry. The term "full scale" indicates that the array to be tested includes a number of memory cells that is generally of the same order of magnitude as the number of memory cells that will be included in a final memory product. Using this approach, the characteristics of the test array can be determined by selectively switching the states of the memory cells and by measuring the characteristics of the memory cells under different operating conditions. This testing technique may be effective in determining the characteristics of a test array, but the production of a full scale tester including peripheral circuitry is very expensive and time consuming.

Another technique for testing arrays involves constructing a test array having a full integration of peripheral circuitry in the test array. The characteristics of the test array can therefore be tested using the peripheral circuitry in the array. This technique is also expensive and time consuming, because it involves constructing a completed array during the testing phase.

Another technique for testing memory arrays is to construct a test array that is smaller in scale than the memory array that will be used in the final memory product. The results from the small scale test array are utilized as representative of the results of a full scale memory array. This technique may be unsatisfactory because small scale testing cannot duplicate loading effects, settling times, and other phenomena that occur in full scale arrays. Small scale testing therefore may not be sufficiently accurate for some applications.

A need therefore exists for a test array and a method for accurately testing memory arrays that do not involve excessive cost or delay.

SUMMARY

According to a first aspect, a test array comprises a plurality of row conductors, a plurality of column conductors, and a plurality of memory cells located at cross points of the row and column conductors. The row and the column conductors can include groups of conductors that are electrically coupled, or "ganged" together. The ganged conductors may be coupled to a common terminal. The row and column conductors also include conductors that are connected to individual terminals. Memory cells located at cross points of row and column conductors connected to individual terminals can have their characteristics measured by a test apparatus during testing. The groups of ganged row and column conductors can have common currents or potentials applied to the ganged conductors during testing.

According to the first aspect, the number of terminals of the test array may be relatively small. Therefore, a test apparatus having a limited or a fixed number of probes for connection to the test array can be used to test the array. By selectively ganging together row and/or column conductors, a very large test array can be tested with a test apparatus having a relatively small number of probes.

Also according to the first aspect, the test array can be tested at full scale without undue expense. In addition, a full integration of switching and other circuitry is not required in the test array for testing. Therefore, a test array can be assembled relatively cheaply and quickly, reducing the time and cost for development of new arrays.

Also according to the first aspect, the use of a full scale test array provides more reliable test data than small scale test data because loading effects, settling times, and other characteristics are more accurately predicted by full scale arrays. This feature helps ensure that test data from selected memory cells in the test array are representative of how a full scale final product memory array based on the test array design will perform.

According to a second aspect, a method of testing a test array includes applying an input to a selected row conductor, wherein the selected row conductor crosses a selected memory cell, measuring an output from a selected column conductor, wherein the selected column conductor crosses the selected memory cell, and applying a common input to common terminals of the test array. The common terminals are each coupled to a group of ganged column conductors.

According to the second aspect, the application of a common input to the groups of column conductors allows an expected operational environment of the test array to be simulated. Because the common input can be applied to groups of column conductors through the common terminals, the test array requires fewer terminals to connect to the test apparatus used to test the test array. In addition, the test apparatus requires fewer probes for connection with the test array terminals.

Other aspects and advantages will become apparent from the following detailed description, taken in conjunction with the accompanying figures.

BRIEF DESCRIPTION OF THE FIGURES

The detailed description will refer to the following figures wherein like reference numerals refer to like elements and wherein.

DETAILED DESCRIPTION

Test arrays and a method for testing arrays will be discussed by way of preferred embodiments and by way of the figures.

Figure 1:
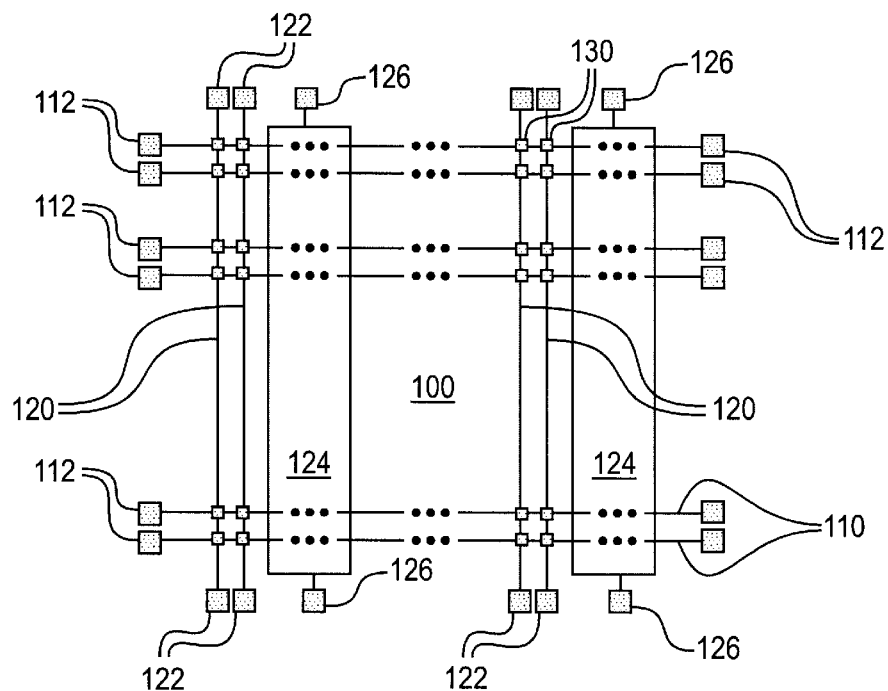
FIG. 1 is a schematic view of a test array according to a first embodiment.

FIG. 1 is a schematic view of a test array 100 according to a first embodiment. The test array 100 includes a plurality of row conductors 110 and column conductors 120. The row conductors 110 cross the column conductors 120 at memory cells 130. The test array 100 is a cross point memory array, and can be of any cross point memory type, such as, for example, a magnetic random access memory (MRAM), a fuse memory, an anti-fuse memory, a charge storage, a mask read only (mask ROM) memory, and other memory types.

The row conductors 110 of the test array 100 terminate in conductive terminals 112, and the column conductors 120 terminate in conductive terminals 122. In FIG. 1, the terminals 112, 122 are illustrated as conductive pads. However, any form of conductive terminal is appropriate for use in the test array 100. The terminals 112, 122 are used to couple the test array 100 to a test device (not illustrated in FIG. 1) to determine characteristics of the memory array 100. The terminals 112, 122 can be disposed over a substrate (not illustrated) of the array 100. The test array 100 illustrated in FIG. 1 comprises q row conductors 110, p column conductors 120, and p×q memory cells 130, where p and q are integers.

According to the first embodiment, a number of the column conductors 120 of the test array 100 are electrically coupled, or "ganged" together as a group 124, and have a common output at common terminals 126. A "group" can comprise, for example, two or more conductors (the individual conductors in the groups 124 are not shown for illustrative purposes). In FIG. 1, the first two column conductors 110 each terminate in individual terminals 122. The column conductors 120 in columns 3 through n are electrically coupled and terminate in common terminals 126, where n is an integer. The effect of this arrangement is to reduce the number of terminals for connection with a test apparatus during testing of the test array 100. The common terminals can be disposed over a substrate (not illustrated) of the test array 100.

Because specified column conductors 120 share common terminals 126, test data would not ordinarily be gathered from the memory cells 130 that are coupled to the ganged column conductors 120. Data is ideally taken from memory cells 130 crossing column conductors 120 that have individual terminals 122. A tester therefore determines what number of memory cells 130 should be accessible to test measurements to provide a statistically representative sample of the characteristics of the test array 100. A number of column conductors 120 are chosen to terminate in the individual conductive pads 122 to allow measurements of the desired sample population of memory cells 130. The remaining column conductors 120 can be ganged into the groups 124. The number of column conductors 120 having individual terminals 122 may therefore depend upon the size of test array 100, and the statistical sample (i.e., the number of memory cells 130 accessible for measurement) desired for a particular application.

The inclusion of the common terminals 126 allows common inputs, such as, for example, potentials, currents, or other inputs, to be applied to the ganged conductors 120 in the groups 124. Potentials, currents, and other inputs may be applied to the groups 124 during testing in order to simulate an expected operating environment for the test array 100. An expected operational environment of the device is, generally, the conditions anticipated for a final product memory array based on the test array 100 design. This feature helps ensure that test data from selected memory cells 130 in the test array 100 are representative of how a memory array based on the test array 100 design will perform in actual operation.

Depending upon the test measurements to be taken from the test array 100, the groups 124 and the column conductors 120 may need only one terminal 126, 122, respectively. For example, if the testing process for a test array 100 will only involve the application of a potential to selected column conductors 120, the column conductors 120 may need only one terminal 122, 126, rather than a terminal 122, 126 at each end.

In FIG. 1, two column conductors 120 terminate in individual terminals 122, and 3-n column conductors 120 share a common terminal 126. The pattern of 1, 2, 3-n, 1, 2, 3-n . . . repeats over the p column conductors 120. The pattern of 1, 2, 3-n, 1, 2, 3-n . . . is exemplary of an arrangement for ganging together selected column conductors 120, and other arrangements are possible. One possible alternative arrangement is, for example 1, 2-n, 1, 2-n, . . . .

Figure 2:
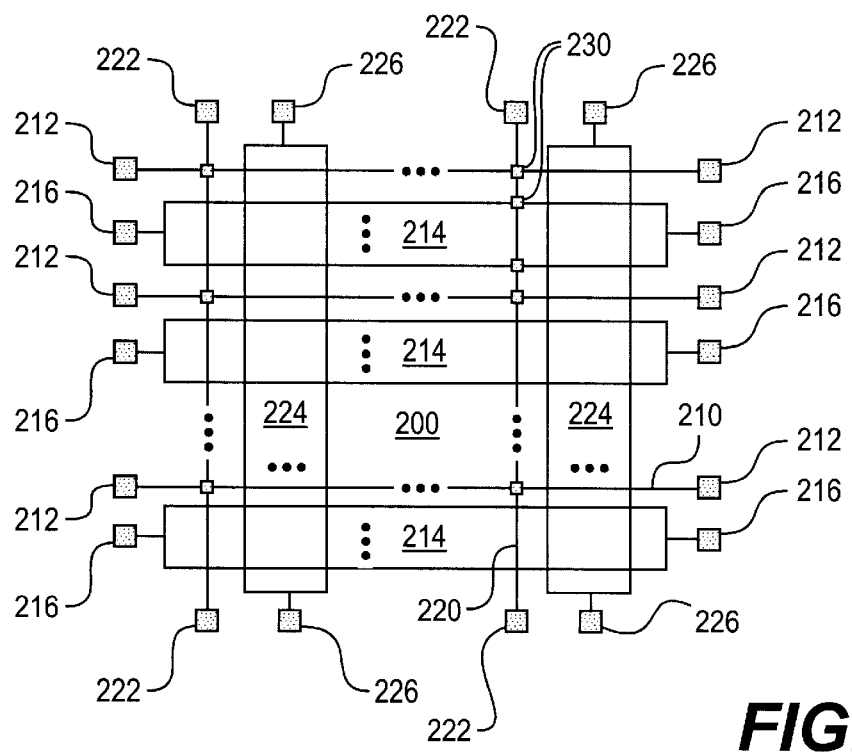
FIG. 2 is a schematic view of a test array according to a second embodiment.

In FIG. 1, only selected column conductors 120 are electrically coupled to reduce the number of terminals for connection with a test apparatus during testing. FIG. 2 illustrates an alternative embodiment of a test array 200 having ganged row and column conductors.

Referring to FIG. 2, the memory array 200 includes row conductors 210 that either terminate in individual terminals 212, or that are ganged together as a group 214 and that share common terminals 216. Similarly, the column conductors 220 either terminate in individual terminals 222, or are ganged together as a group 224 and share common terminals 226. In FIG. 2, the terminals 212, 222, 216, 226 are illustrated as conductive pads. However, any form of conductive terminal is appropriate for use in the test array 200. The terminals 212, 222, 216, 226 can be disposed over a substrate (not illustrated) of the test array 200.

The row conductors 210 include a repeating pattern of 1 individual conductor 210 followed by 2 through m ganged conductors 210, with a total of q row conductors 210. The column conductors 220 include a repeating pattern of 1 column conductor 220 followed by 2-n ganged column conductors 220, totaling p column conductors 220. In this embodiment, m, n, p and q are integers.

According to the above embodiments, a test array can include a selected number of row and/or column conductors that are electrically coupled, or ganged together, to reduce the number of terminals for connection with test probes during the testing process. One advantage to this arrangement is that test arrays of different size can be tested by a test apparatus having a relatively small number of probes. Advantageously, test arrays in a particular lab or other testing environment can be constructed to correspond to one of a set of a standardized number of terminals, so that a single test apparatus can be utilized to test a variety of test arrays. The number of terminals in test arrays can be standardized by selectively ganging a greater or lesser number of row and/or column conductors into groups.

Another advantage to the above embodiments is that a test array having a relatively large number of memory cells can be accurately tested. In other words, the test array can be tested at full size. Therefore characteristics such as loading effects, defect density, settling times, and other characteristics of the test array will be similar to a final product memory array based on the test array design. In addition, there is no requirement for the integration of switching circuitry and other peripheral circuitry in order to test the test array.

Figure 3:
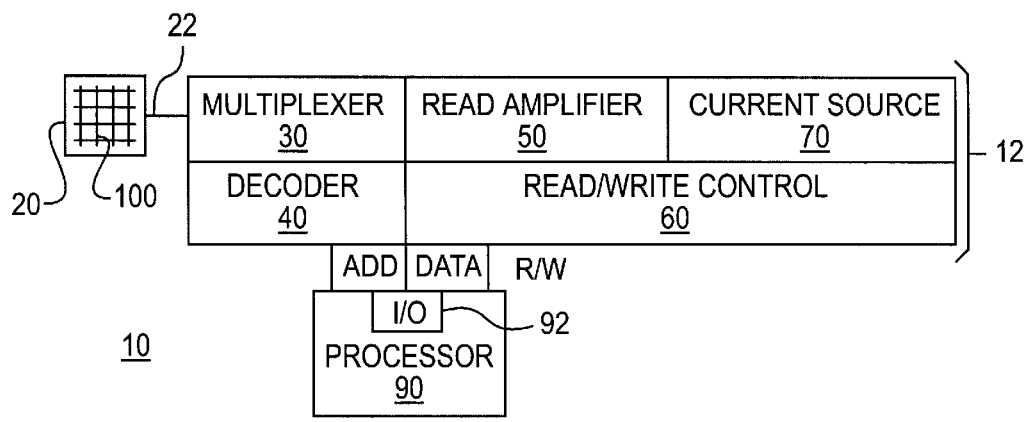
FIG. 3 is a schematic view a test apparatus.
Figure 4:
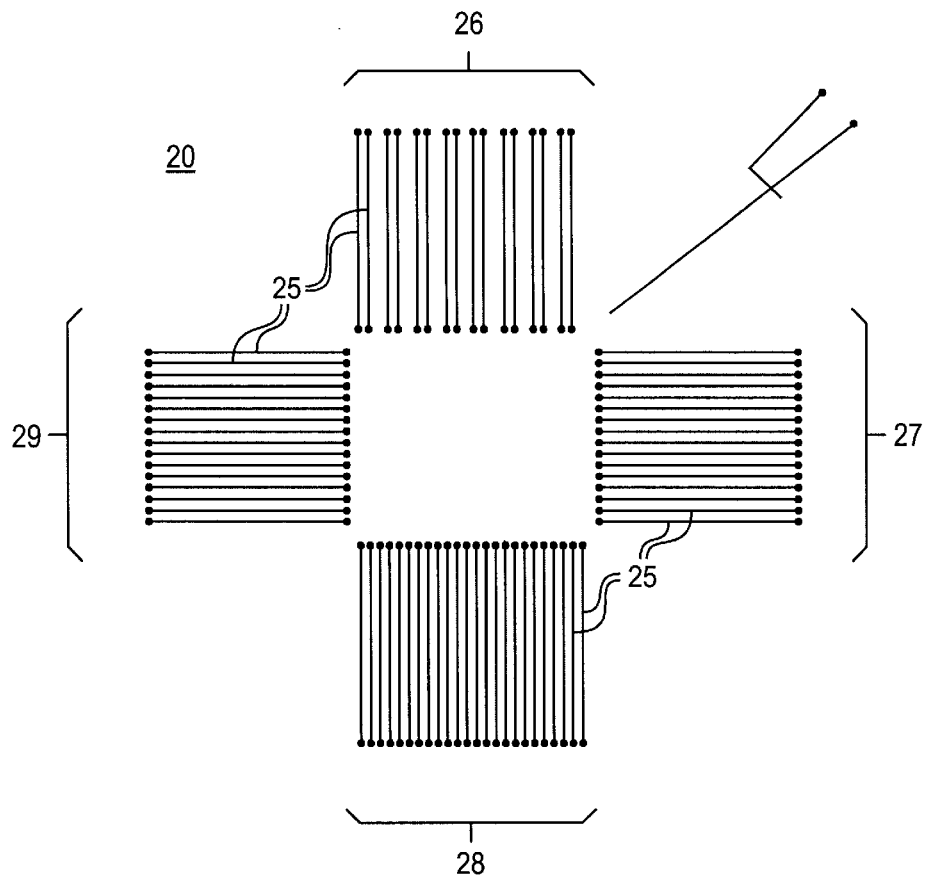
FIG. 4 is a schematic view of test board of the test apparatus illustrated in FIG. 3.

A test apparatus 10 for testing test arrays is discussed below with reference to FIGS. 3 and 4. FIG. 3 is a schematic view of the test apparatus 10, and FIG. 4 is a schematic view of a test board 20 of the test apparatus 10.

Referring to FIG. 3, the test apparatus 10 comprises a test board 20, test electronics 12, and a processor 90. The test board 20 is coupled to the test electronics 12 by conductors 22. The test electronics 12 comprises a multiplexer 30, a decoder 40, a read amplifier 50, a read/write control 60, and a current source 70. The processor 90 is coupled to the test electronics 12 via Add, Data, and R/W lines through an I/O device 92.

In FIG. 3, the test board 20 is symbolically represented with a test array 100 mounted on the test board 20, however other test array embodiments discussed in this specification may also be tested with the test apparatus 10. The test board 20 supports the test array 100 during testing, and includes conductive probes that can provide inputs to row and column conductors 110, 120 of the test array 100, and can also receive outputs from the row and column conductors 110, 120. The test array 100 is mounted on the test board 20 so that selected probes of the test board 20 contact selected terminals of the test array 100. The test board 20 is discussed in detail below with reference to FIG. 4.

The test apparatus 10 can supply, for example, inputs such as potentials and currents to ganged row and column conductors 110, 120 to simulate an expected operational environment for the test array 100. The processor 90 controls the testing process, and may comprise, for example, a central processing unit. The processor 90 can operate the test apparatus 10 in either a write mode, in which memory cells 130 in the test array 100 can be programmed, or a read mode, in which characteristics of the test array 100 can be measured. The read/write control 60 controls the test electronics 12 in the read and write modes. The multiplexer 30 serves to multiplex signals between the row and column conductors 110, 120, and the decoder 40 decodes data to and from the multiplexer 30. Data from the test array 100, such as current magnitudes, are detected by the read amplifier 50 before forwarding to the processor 90 on the Data line. The current source 70 can be a programmable current source used to supply write currents to the test array 100. The test electronics 12 can also include digital-to-analog converters and other converters so that the current source 70 can provide, for example, read voltages and other inputs to the test array 100.

FIG. 4 is a schematic view of the test board 20. The test board 20 includes a plurality of probes 25 for contacting conductive terminals of a test array. The probes 25 are arranged in sets 26–29 to contact both individual and common terminals of a test array when the test array is placed on the test board 20. The sets 26–29 may each have differing numbers of probes 25 to accommodate different test array configurations.

Each of the probes 25 may be connected to one of the conductors 22 leading to the test electronics 12. The controller 90 can instruct the test electronics 12 to receive an output from a column or row conductor coupled to a particular probe 25, or to apply an input, such as a write voltage or current, or a read voltage or current, to a column or row conductor coupled to a particular probe 25.

A test array can be oriented in several ways on the test board 20 by rotating the test array 90 degrees before mounting on the test board 20. This feature allows different arrangements of row and column conductors to be coupled to different sets 26–29 of probes 25.

According to the above embodiments, the number of probes 25 on the test board 20 can be relatively small because row and column conductors in a test array can be ganged to receive a common input from the test board 20. For example, in FIG. 4, the test board 20 includes 16 probes in set 26, and 24 probes in set 28. The probes in set 26, and the corresponding (i.e., directly across from) probes in set 28, can be coupled to column conductors having individual terminals. The probes in set 28 that do not correspond to a probe in set 26 can be coupled to a common terminal in the test array to allow, for example, an equal potential to be applied to ganged column conductors.

In one mode of operation, a selected memory cell located at the cross point of a row line and a column conductor having an individual terminal can have its resistance measured by the test apparatus 10. In this mode, a read current is generated by applying a read voltage to the row line crossing the selected memory cell, and the column conductor crossing the selected memory cell can be coupled to the test electronics 12 via the conductors 22. The column conductor crossing the selected memory cell includes an individual terminal. The value of the read current through the selected memory cell can be determined by the read amplifier 50. The processor 90 can determine the selected memory cell 130 resistance from the read current value. During the read operation, a common input, such as a potential, can be applied to the remaining column conductors in the test array, including ganged and individual conductors.

In the above examples, if selected column conductors were not ganged, a probe would be required to contact a terminal of each column conductor terminal in order to provide every column conductor of the test array with the potential. This feature is particularly advantageous in applications in which an equal potential, or another common input, is used to simulate expected operating conditions in the test array.

According to the above embodiments, common inputs can be supplied to any conductors in a test array without undue expense or delay in the development process. The test array can be at or near full scale, so that loading effects, settling times, and other characteristics measured from the test array can be similar to a final product array based on the test array design.

A further advantage is that the test apparatus 10 can be used to test arrays of different size. By ganging together selected numbers of row and column conductors, a fixed number of conductive pads can be used in any test array. Therefore, a test apparatus 10 having a fixed or limited number of probes can be used to test various arrays.

In the present specification, the terms "row" and "column" do not imply a fixed orientation in a memory array. In addition, the terms "row" and "column" do not necessarily imply an orthogonal relationship.

While the testing methods and apparatuses have been described with reference to the exemplary embodiments thereof, those skilled in the art will be able to make various modifications to the described embodiments of the invention without departing from the true spirit and scope of the invention. The terms and descriptions used herein are set forth by way of illustration only and are not meant as limitations.

What is claimed is:

1. A test array, comprising:
   a plurality of first conductors, comprising:
   at least one group of the first conductors, wherein the first conductors in the group are electrically coupled to a common terminal of the group; and at least one first conductor coupled to a terminal;

a plurality of second conductors; and a plurality of memory cells located at cross points of the first and second conductors.

2. The test array of claim 1, wherein the at least one group of first conductors comprises a plurality of groups of first conductors, and the at least one first conductor comprises a plurality of first conductors.

3. The test array of claim 2, wherein the plurality of first conductors comprises a repeating pattern of alternating groups of first conductors and first conductors coupled to individual terminals.

4. The test array of claim 3, wherein the common terminals are disposed over a substrate of the test array.

5. The test array of claim 3, wherein the plurality of second conductors comprises:

at least one group of the second conductors, wherein the second conductors in the group are electrically coupled to a common terminal of the group; and at least one second conductor coupled to an individual terminal.

6. The test array of claim 5, wherein the at least one group of second conductors comprises a plurality of groups of second conductors, and the at least one second conductor comprises a plurality of second conductors.

7. The test array of claim 6, wherein the plurality of second conductors comprises a repeating pattern of alternating groups of second conductors and second conductors coupled to individual terminals.

8. The test array of claim 5, wherein the common terminal is disposed over a substrate of the test array.

9. A method of testing an array comprising a plurality of first conductors, a plurality of second conductors, and a plurality of memory cells located at crossing points of the first and second conductors, the method comprising:

applying an input to a selected one of the second conductors, wherein the selected second conductor crosses a selected memory cell;

measuring an output from a selected first conductor, wherein the selected second conductor crosses the selected memory cell; and applying a common input to at least one common terminal of the test array, wherein a group of the plurality of first conductors is coupled to the at least one common terminal.

10. The method of claim 9, wherein the step of applying a common input comprises:

applying a common input to a plurality of common terminals, wherein each common terminal is coupled to a corresponding group of first conductors.

11. The method of claim 10, wherein the step of measuring an output comprises:

measuring a current value.

12. The method of claim 11, wherein the step of applying an input comprises:

applying a potential.

13. The method of claim 12, wherein the step of applying a common input comprises:

applying an equal potential to the common terminals.

14. The method of claim 10, wherein the common terminals are disposed over a substrate of the array.

15. The method of claim 14, wherein the step of applying a common input comprises:

contacting the common terminals with probes of a test device.

* * * * *